United States Patent
Kato (10) Patent No.: US 9,952,286 B2
(45) Date of Patent: Apr. 24, 2018

(54) POWER-SUPPLY CONTROL DEVICE AND PROGRAMMABLE LOGIC CONTROLLER

(71) Applicant: Mitsubishi Electric Corporation, Tokyo (JP)

(72) Inventor: Akihisa Kato, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 269 days.

(21) Appl. No.: 14/784,074

(22) PCT Filed: Mar. 17, 2014

(86) PCT No.: PCT/JP2014/057165
§ 371 (c)(1),
(2) Date: Oct. 13, 2015

(87) PCT Pub. No.: WO2015/140909
PCT Pub. Date: Sep. 24, 2015

(65) Prior Publication Data
US 2016/0061896 A1   Mar. 3, 2016

(51) Int. Cl.
*G01R 31/327*   (2006.01)
*H02H 3/04*   (2006.01)
*H02J 1/00*   (2006.01)

(52) U.S. Cl.
CPC .......... *G01R 31/327* (2013.01); *H02H 3/044* (2013.01); *H02J 1/00* (2013.01)

(58) Field of Classification Search
CPC ............ G01R 31/327; H02H 3/04; H02J 1/00
See application file for complete search history.

(56) References Cited

U.S. PATENT DOCUMENTS 4,636,907 A * 1/1987 Howell ................. H01H 9/542
307/137
9,267,992 B2 * 2/2016 Shiraishi .............. G01R 31/327
(Continued)

FOREIGN PATENT DOCUMENTS

DE      10127233 C1    11/2002
EP       2339604 B1     8/2012
(Continued)

OTHER PUBLICATIONS

Communication dated May 12, 2016, issued by the German Patent Office in counterpart German Application No. 112014002062.1.
(Continued)

*Primary Examiner* — Scott Bauer
(74) *Attorney, Agent, or Firm* — Sughrue Mion, PLLC; Richard C. Turner (57) ABSTRACT

A power-supply control device includes a power-source input terminal, an output circuit outputting power to load, power interrupting circuits connected in parallel between the power-source input terminal and the output circuit, and a control circuit controlling each power interrupting circuit separately. Each power interrupting circuit includes an interrupting circuit and a switch element connected in series between the power-source input terminal and the output circuit. The interrupting circuit permits power to pass when receiving a passage permitting signal from the control circuit and interrupts passage of power when not receiving the passage permitting signal. ON/OFF of the switch element is controlled by the control circuit. When any of the power interrupting circuits is set as a diagnostic target circuit, the control circuit stops supplying the passage permitting signal to the interrupting circuit of the diagnostic target circuit and turns off the switch element of the diagnostic target circuit.

9 Claims, 7 Drawing Sheets

(56) References Cited

U.S. PATENT DOCUMENTS

2004/0160131 A1    8/2004   Veil et al.
2010/0225330 A1    9/2010   Watanabe

FOREIGN PATENT DOCUMENTS

| JP | 3-135320 A | 6/1991 |
| --- | --- | --- |
| JP | 7-241026 A | 9/1995 |
| JP | 2000-235405 A | 8/2000 |
| JP | 2009-75481 A | 4/2009 |
| JP | 200975841 A | 4/2009 |
| JP | 2010-206114 A | 9/2010 |
| JP | 2011-055637 A | 3/2011 |
| WO | 2013/186888 A1 | 12/2013 |

OTHER PUBLICATIONS

JPO Office Action for Application No. 2014-528720 dated Aug. 8, 2014.
International Search Report for PCT/JP2014/057165 dated May 13, 2014 [PCT/ISA/210].
Written Opinion for PCT/JP2014/057165 dated May 13, 2014 [PCT/ISA/237].
Communication dated Dec. 15, 2015, issued by the Korean Intellectual Property Office in corresponding Korean Application No. 10-2015-7032196.
Communication dated Nov. 16, 2015, issued by the Taiwan Patent Office in corresponding Taiwanese Application No. 103133467.

\* cited by examiner

POWER-SUPPLY CONTROL DEVICE AND PROGRAMMABLE LOGIC CONTROLLER

CROSS REFERENCE TO RELATED APPLICATIONS

This application is a National Stage of International Application No. PCT/JP2014/057165, filed on Mar. 17, 2014, the contents of all of which are incorporated herein by reference in their entirety.

FIELD

The present invention relates to a power-supply control device that controls power supply to a load and a programmable logic controller having the power-supply control device incorporated therein.

BACKGROUND

As techniques for automatically detecting and canceling abnormalities of electric devices, the following techniques are known.

Patent Literature 1 discloses a latch-up automatic canceling device for a programmable controller. When a latched-up occurs in the programmable controller, the latch-up automatic canceling device automatically cancels the latch-up.

Patent Literature 2 discloses an I/O relay terminal that controls one load by operating a plurality of relays with one input signal from a sequencer. This I/O relay terminal has a fault detecting function. Specifically, when one of the relays has a fault, the details of the fault are displayed on a display unit, and the relay having the fault is forcibly turned off.

Patent Literature 3 discloses a technique for preventing an inrush current or an overcurrent in one load unit in an electrical device including a plurality of load units. Specifically, a breaker with an overcurrent tripping function and an overcurrent preventing circuit are provided in each of the load units.

CITATION LIST

Patent Literatures

Patent Literature 1: Japanese Patent Application Laid-open No. 2000-235405
Patent Literature 2: Japanese Patent Application Laid-open No. H3-135320
Patent Literature 2: Japanese Patent Application Laid-open No. H7-241026

SUMMARY

Technical Problem

In a power-supply control device that controls power supply to a load, it is desirable to stop the power supply to the load when an abnormality is detected. To stop the power supply, it is possible to install in the power-supply control device an interrupting circuit that interrupts the power supply. To ensure the reliability of the power-supply control device, it is desirable to diagnose whether the interrupting circuit operates normally. However, in the Patent Literatures 1 to 3 listed above, it is not possible to diagnose at any given timing whether a target circuit operates normally.

As for a diagnosis of an interrupting circuit, the present inventors have paid attention to the following point: when the interrupting circuit is operated for a diagnosis, if the interrupting circuit is normal, power supply to the load is interrupted and the load stops its operation. That is, the productivity is lowered in return for performing a diagnosis.

An object of the present invention is to provide, in a power-supply control device that controls power supply to a load, a technique with which it is possible to diagnose whether an interrupting circuit operates normally without stopping the power supply.

Solution to Problem

According to an aspect of the present invention, a power-supply control device is provided. The power-supply control device include: a power-source input terminal to which power is input from a power source; an output circuit that outputs the power to a load; a plurality of power interrupting circuits that are connected in parallel between the power-source input terminal and the output circuit; and a control circuit that controls each of the power interrupting circuits separately. Each of the power interrupting circuits includes an interrupting circuit and a switch element that are connected in series between the power-source input terminal and the output circuit. The interrupting circuit is configured to permit the power to pass when the interrupting circuit is receiving a passage permitting signal from the control circuit and to interrupt passage of the power when the interrupting circuit is not receiving the passage permitting signal. ON/OFF of the switch element is controlled by the control circuit. When any of the power interrupting circuits is set as a diagnostic target circuit, the control circuit stops supplying the passage permitting signal to the interrupting circuit of the diagnostic target circuit and turns off the switch element of the diagnostic target circuit.

According to another aspect of the present invention, a programmable logic controller that executes drive control of a device is provided. The programmable logic controller includes: a power-source input terminal to which power is input from a power source; an output circuit that outputs the power to the device; a plurality of power interrupting circuits that are connected in parallel between the power-source input terminal and the output circuit; and a control circuit that controls each of the power interrupting circuits separately. Each of the power interrupting circuits includes an interrupting circuit and a switch element that are connected in series between the power-source input terminal and the output circuit. The interrupting circuit is configured to permit the power to pass when the interrupting circuit is receiving a passage permitting signal from the control circuit and to interrupt passage of the power when the interrupting circuit is not receiving the passage permitting signal. ON/OFF of the switch element is controlled by the control circuit. When any of the power interrupting circuits is set as a diagnostic target circuit, the control circuit stops supplying the passage permitting signal to the interrupting circuit of the diagnostic target circuit and turns off the switch element of the diagnostic target circuit.

Advantageous Effects of Invention

According to the present invention, it is possible, in a power-supply control device that controls power supply to a load, to diagnose whether an interrupting circuit operates normally without stopping the power supply.

DESCRIPTION OF EMBODIMENTS

Exemplary embodiments of the present invention are explained with reference to the accompanying drawings.

First Embodiment

<Configuration Example of Power-Supply Control Device>

Figure 1:
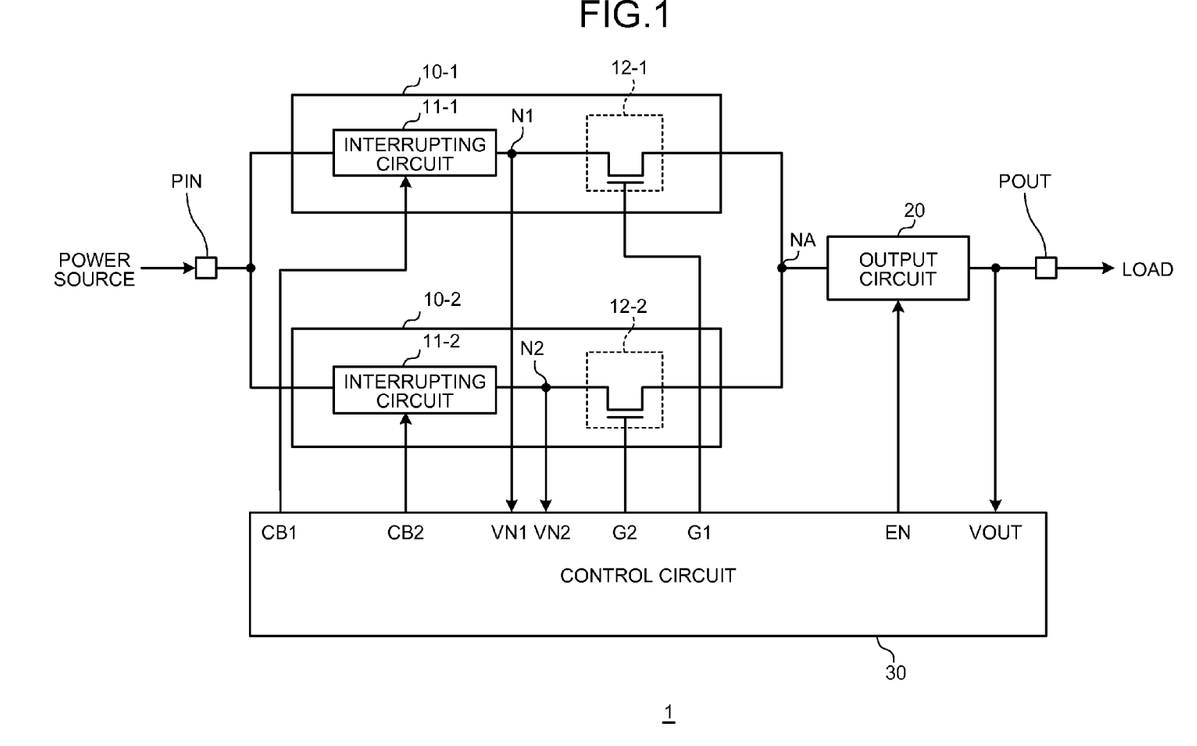
FIG. 1 is a block diagram illustrating a configuration example of a power-supply control device according to a first embodiment of the present invention.

FIG. 1 is a block diagram illustrating a configuration example of a power-supply control device 1 according to a first embodiment of the present invention. The power-supply control device 1 is a device that controls power supply from a power source to a load. The power-supply control device 1 has a power-source input terminal PIN, which is connected to a power source, and an output terminal POUT, which is connected to a load. Power is input from the power source to the power-source input terminal PIN, and the power is output from the output terminal POUT to the load through the power-supply control device 1.

The power-supply control device 1 according to the present embodiment has a function of enabling it to interrupt the power supply to the load as needed. More specifically, the power-supply control device 1 includes a plurality of power interrupting circuits 10, an output circuit 20, and a control circuit 30.

The power interrupting circuits 10 are connected in parallel between the power-source input terminal PIN and an output node NA. As an example, FIG. 1 illustrates two power interrupting circuits 10, which are a first power interrupting circuit 10-1 and a second power interrupting circuit 10-2. Each of the power interrupting circuits 10 permits or prohibits (interrupts) the passage of power from the power-source input terminal PIN to the output node NA in accordance with a control signal transmitted from the control circuit 30, which is described later.

More specifically, each of the power interrupting circuits 10 includes an interrupting circuit 11 and a switch element 12 that are connected in series between the power-source input terminal PIN and the output node NA. For example, in the first power interrupting circuit 10-1, a first interrupting circuit 11-1 is connected between the power-source input terminal PIN and a first intermediate node N1 and a first switch element 12-1 is connected between the first intermediate node N1 and the output node NA.

The first interrupting circuit 11-1 permits or prohibits (interrupts) the passage of power in accordance with a first control signal CB1 output from the control circuit 30. More specifically, when the first control signal CB1 is a "passage permitting signal", the first interrupting circuit 11-1 permits the passage of power. In other cases, the first interrupting circuit 11-1 interrupts the passage of power. That is, the first interrupting circuit 11-1 permits power to pass when the first interrupting circuit 11-1 is receiving a "passage permitting signal" from the control circuit 30, and interrupts the passage of power when the first interrupting circuit 11-1 is not receiving any "passage permitting signal".

Figure 2:
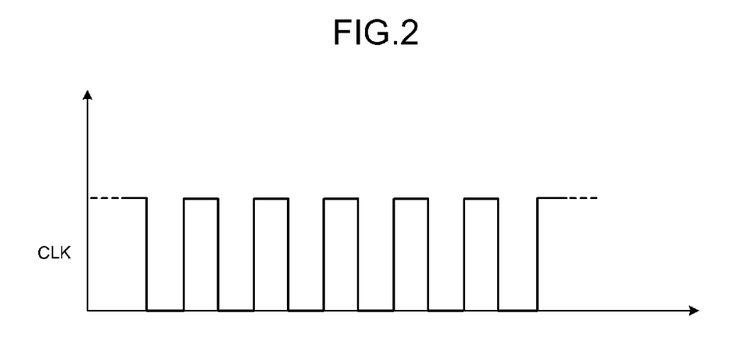
FIG. 2 is a conceptual diagram illustrating an example of a passage permitting signal to be supplied to an interrupting circuit of the power-supply control device according to the first embodiment of the present invention.

The passage permitting signal is, for example, a clock signal CLK as illustrated in FIG. 2. In this case, an element that operates on the basis of the clock signal CLK is incorporated in the first interrupting circuit 11-1. While the clock signal CLK is supplied, this element is operated so that the first interrupting circuit 11-1 permits power to pass. In contrast, when supply of the clock signal CLK is stopped, the element also stops operating and the passage of power is interrupted.

Figure 3:
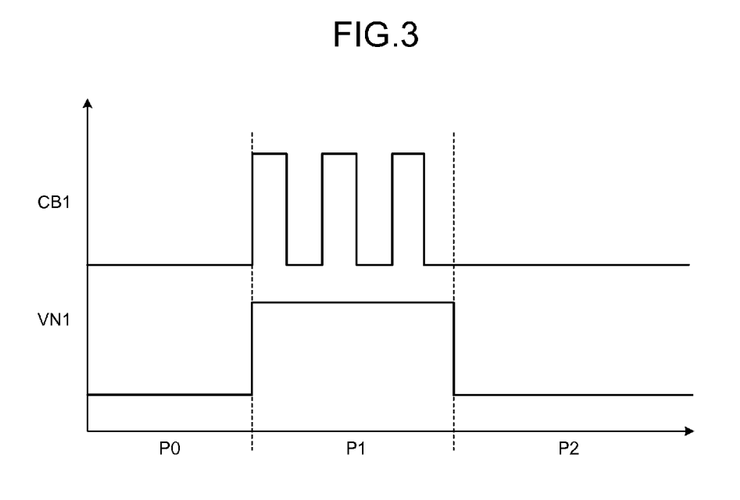
FIG. 3 is a timing chart illustrating an operation example of the interrupting circuit of the power-supply control device according to the first embodiment of the present invention.

FIG. 3 illustrates an operation example of the first interrupting circuit 11-1 when the passage permitting signal is the clock signal CLK. During a period P0, the power-supply control device 1 is powered off.

During a period P1, the power-supply control device 1 is powered on, and the control circuit 30 outputs the clock signal CLK (a passage permitting signal) as the first control signal CB1. When the first interrupting circuit 11-1 receives the clock signal CLK as the first control signal CB1, the first interrupting circuit 11-1 permits the passage of power. That is, the power-source input terminal PIN and the first intermediate node N1 are in electrical communication with each other. As a result, a first intermediate node voltage VN1, which is the voltage at the first intermediate node N1, becomes a High level.

During a period P2, the control circuit 30 stops supplying the clock signal CLK (a passage permitting signal) to the first interrupting circuit 11-1. For example, the control circuit 30 keeps the first control signal CB1 supplied to the first interrupting circuit 11-1 at a Low level. In this case, the first interrupting circuit 11-1 prohibits the passage of power. That is, the electrical connection between the power-source input terminal PIN and the first intermediate node N1 is cut off. As a result, the first intermediate node voltage VN1 becomes ground level. The same holds true for a case where the first control signal CB1 is kept at a High level.

With reference again to FIG. 1, ON/OFF of the first switch element 12-1 is controlled by the control circuit 30. More specifically, ON/OFF of the first switch element 12-1 is controlled by a first switch signal G1 output from the control circuit 30.

For example, when the first switch signal G1 is at a High level, the first switch element 12-1 is turned on, and the first intermediate node N1 and the output node NA are electrically connected to each other. In contrast, when the first switch signal G1 is at a Low level, the first switch element 12-1 is turned off and the electrical connection between the first intermediate node N1 and the output node NA is cut off. The first switch element 12-1 is, for example, a MOS transistor including a gate to which the first switch signal G1 is input.

The configuration of the second power interrupting circuit 10-2 is identical to that of the first power interrupting circuit 10-1. That is, in the second power interrupting circuit 10-2, a second interrupting circuit 11-2 is connected between the power-source input terminal PIN and a second intermediate node N2 and a second switch element 12-2 is connected between the second intermediate node N2 and the output node NA.

The second interrupting circuit 11-2 permits or prohibits (interrupts) the passage of power in accordance with a second control signal CB2 output from the control circuit 30. More specifically, when the second control signal CB2 is a "passage permitting signal", the second interrupting circuit 11-2 permits the passage of power. In other cases, the second interrupting circuit 11-2 interrupts the passage of power. That is, the second interrupting circuit 11-2 permits power to pass when the second interrupting circuit 11-2 is receiving a "passage permitting signal" from the control circuit 30, and interrupts the passage of power when the second interrupting circuit 11-2 is not receiving any "passage permitting signal". The passage permitting signal is, for example, the clock signal CLK as illustrated in FIG. 2. ON/OFF control of the second switch element 12-2 is executed by the control circuit 30. More specifically, ON/OFF control of the second switch element 12-2 is executed in accordance with a second switch signal G2 output from the control circuit 30. The second switch element 12-2 is, for example, a MOS transistor including a gate to which the second switch signal G2 is input.

In the respective power interrupting circuits 10, the order of the interrupting circuit 11 and the switch element 12 can be switched.

The output circuit 20 is connected between the output node NA and the output terminal POUT and outputs power to a load through the output terminal POUT. ON/OFF control of the output circuit 20 is also executed by the control circuit 30. More specifically, ON/OFF control of the output circuit 20 is executed in accordance with an output control signal EN output from the control circuit 30. For example, when the output control signal EN is at a High level, the output circuit 20 is turned on and outputs power to the load. In contrast, when the output control signal EN is at a Low level, the output circuit 20 is turned off and stops the output of power to the load.

The control circuit 30 is, for example, formed of a microcomputer. The control circuit 30 separately controls each of the power interrupting circuits 10 and the output circuit 20. Specifically, the control circuit 30 controls operations of the first power interrupting circuit 10-1 by using the first control signal CB1 and the first switch signal G1 described above. Further, the control circuit 30 controls operations of the second power interrupting circuit 10-2 by using the second control signal CB2 and the second switch signal G2 described above. Further, the control circuit 30 controls operations of the output circuit 20 by using the output control signal EN described above.

The first intermediate node voltage VN1, which is the voltage at the first intermediate node N1, a second intermediate node voltage VN2, which is the voltage at the second intermediate node N2, and an output voltage VOUT, which is the voltage at the output terminal POUT, are input to the control circuit 30. As described later, the control circuit 30 can detect abnormalities in circuits by monitoring the first intermediate node voltage VN1, the second intermediate node voltage VN2, and the output voltage VOUT.

In this way, the control circuit 30 has a function of separately controlling each of the power interrupting circuits 10 and the output circuit 20 and a function of detecting abnormalities. By using these functions, the control circuit 30 can perform, at any given timing, a "diagnosis" as to whether respective constituent elements of the power-supply control device 1 are operated normally. Detailed descriptions of the diagnosis of the respective constituent elements are given below.

<Diagnosis of Power Interrupting Circuit 10>

During a normal operation, the control circuit 30 causes all of the power interrupting circuits 10 to permit the passage of power. When it is desirable to stop the power supply to a load, such as in a case of emergency, the control circuit 30 causes all of the power interrupting circuits 10 to interrupt the passage of power. At this point, if any of the power interrupting circuits 10 has a fault, the power supply to the load does not stop and continues. To ensure reliability, it is preferable to diagnose at any given timing whether the respective power interrupting circuits 10 operate normally.

Diagnoses of the first power interrupting circuit 10-1 and the second power interrupting circuit 10-2 illustrated in FIG. 1 are described with reference to FIG. 4.

During the period P0, the power-supply control device 1 is powered off and operations of each of the circuits are stopped. Thereafter, the power-supply control device 1 is powered on.

The period P1 is a normal operation period. The control circuit 30 outputs the clock signal CLK (the passage permitting signal) as the first control signal CB1 and the second control signal CB2. As a result, both the first interrupting circuit 11-1 and the second interrupting circuit 11-2 permit the passage of power; therefore, both the first intermediate node voltage VN1 and the second intermediate node voltage VN2 become a power-source voltage level. Further, the control circuit 30 sets the first switch signal G1 and the second switch signal G2 to a High level to turn on the first switch element 12-1 and the second switch element 12-2. Further, the control circuit 30 sets the output control signal EN to a High level to turn on the output circuit 20. As a result, power is supplied to a load (the output voltage VOUT=High level), thereby operating the load.

The next period P2 is a period for diagnosing the first power interrupting circuit 10-1. The control circuit 30 sets the first power interrupting circuit 10-1 as a "diagnostic target circuit". Specifically, the control circuit 30 keeps the first control signal CB1 at a Low level to stop the supply of the clock signal CLK (a passage permitting signal) to the first interrupting circuit 11-1. Further, the control circuit 30 sets the first switch signal G1 to a Low level to turn off the first switch element 12-1.

Figure 4:
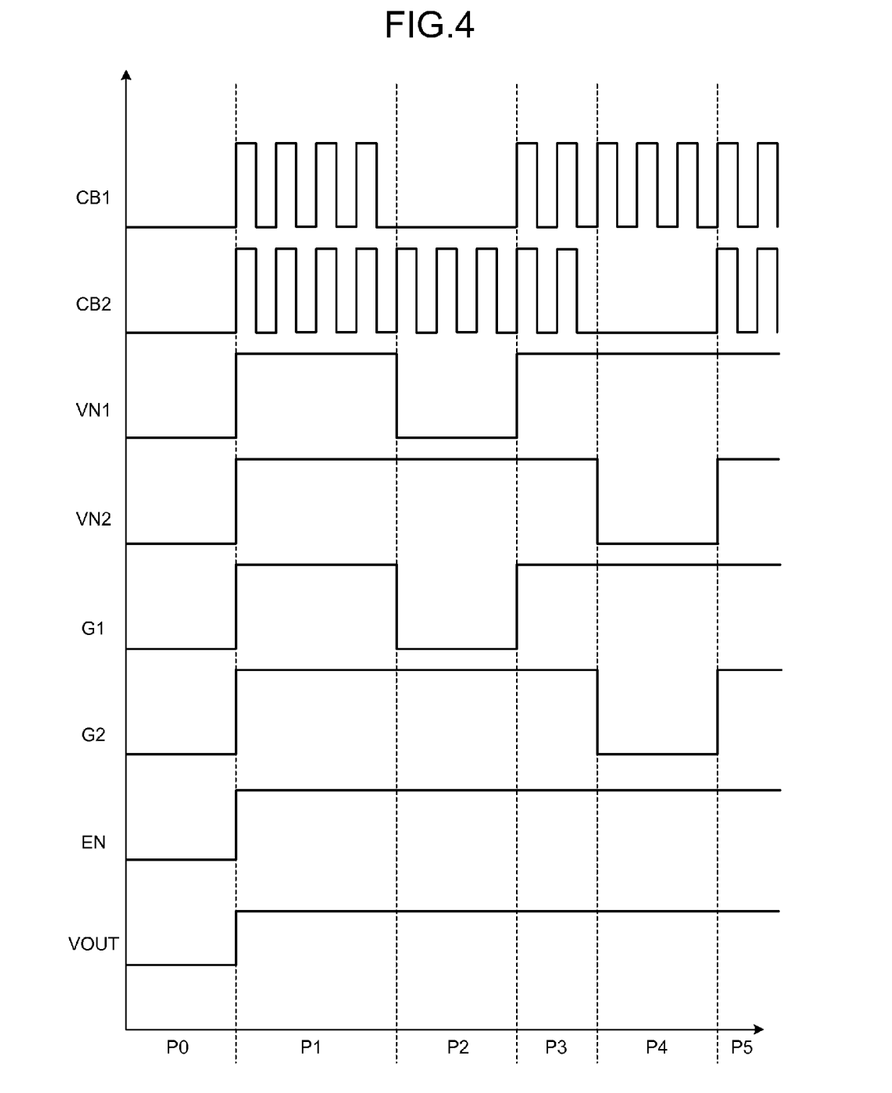
FIG. 4 is a timing chart illustrating an operation example of the power-supply control device according to the first embodiment of the present invention.

When the first power interrupting circuit 10-1 (the first interrupting circuit 11-1 and the first switch element 12-1) operates normally, it is expected that the electrical connection between the first intermediate node N1 and the power source is cut off, and the first intermediate node voltage VN1 becomes a Low level as illustrated in FIG. 4. Accordingly, the control circuit 30 can diagnose whether the first power interrupting circuit 10-1 operates normally by monitoring the first intermediate node voltage VN1 during the period P2.

Note that the state of the second power interrupting circuit 10-2 in the period P2 remains in the state of a normal operation period. That is, the power supply from the power source to the load continues (the output voltage VOUT=High level) through the second power interrupting circuit 10-2. This means that the first power interrupting circuit 10-1 can be diagnosed without stopping the power supply to the load. The reason why the first switch element 12-1 is turned off is that the inflow of power from the output node NA to the first intermediate node N1 is prevented, thereby avoiding the diagnosis from being affected.

When the first intermediate node voltage VN1 changes to a Low level, which is an anticipated value, the control circuit 30 determines that the first power interrupting circuit 10-1 operates normally. In contrast, if the first intermediate node voltage VN1 remains at a High level, the control circuit 30 determines that an abnormality has occurred in the first power interrupting circuit 10-1. The state where an abnormality has occurred in the first power interrupting circuit 10-1 is a state where at least one of the first interrupting circuit 11-1 and the first switch element 12-1 has a fault.

In the example illustrated in FIG. 4, the first power interrupting circuit 10-1 operates normally. In this case, the control circuit 30 causes the first power interrupting circuit 10-1 to return to a normal operation and causes the power supply to be resumed.

A period P3 is a normal operation period and is identical to the period P1 described above.

The next period P4 is a period for diagnosing the second power interrupting circuit 10-2. The control circuit 30 sets the second power interrupting circuit 10-2 as a "diagnostic target circuit". Specifically, the control circuit 30 keeps the second control signal CB2 at a Low level to stop the supply of the clock signal CLK (a passage permitting signal) to the second interrupting circuit 11-2. Further, the control circuit 30 sets the second switch signal G2 to a Low level to turn off the second switch element 12-2.

When the second power interrupting circuit 10-2 (the second interrupting circuit 11-2 and the second switch element 12-2) operates normally, it is expected that the electrical connection between the second intermediate node N2 and the power source is cut off, and the second intermediate node voltage VN2 becomes a Low level as illustrated in FIG. 4. Accordingly, the control circuit 30 can diagnose whether the second power interrupting circuit 10-2 operates normally by monitoring the second intermediate node voltage VN2 during the period P4.

Note that the state of the first power interrupting circuit 10-1 in the period P4 remains in the state of a normal operation period. That is, the power supply from the power source to the load continues (the output voltage VOUT=High level) through the first power interrupting circuit 10-1. This means that the second power interrupting circuit 10-2 can be diagnosed without stopping the power supply to the load. The reason why the second switch element 12-2 is turned off is that the inflow of power from the output node NA to the second intermediate node N2 is prevented, thereby avoiding the diagnosis from being affected.

When the second intermediate node voltage VN2 changes to a Low level, which is an anticipated value, the control circuit 30 determines that the second power interrupting circuit 10-2 operates normally. In contrast, if the second intermediate node voltage VN2 remains at a High level, the control circuit 30 determines that an abnormality has occurred in the second power interrupting circuit 10-2. The state where an abnormality has occurred in the second power interrupting circuit 10-2 is a state where at least one of the second interrupting circuit 11-2 and the second switch element 12-2 has a fault.

In the example illustrated in FIG. 4, the second power interrupting circuit 10-2 operates normally. In this case, the control circuit 30 causes the second power interrupting circuit 10-2 to return to a normal operation and causes the power supply to be resumed.

A period P5 is a normal operation period and is identical to the period P1 described above.

Figure 5:
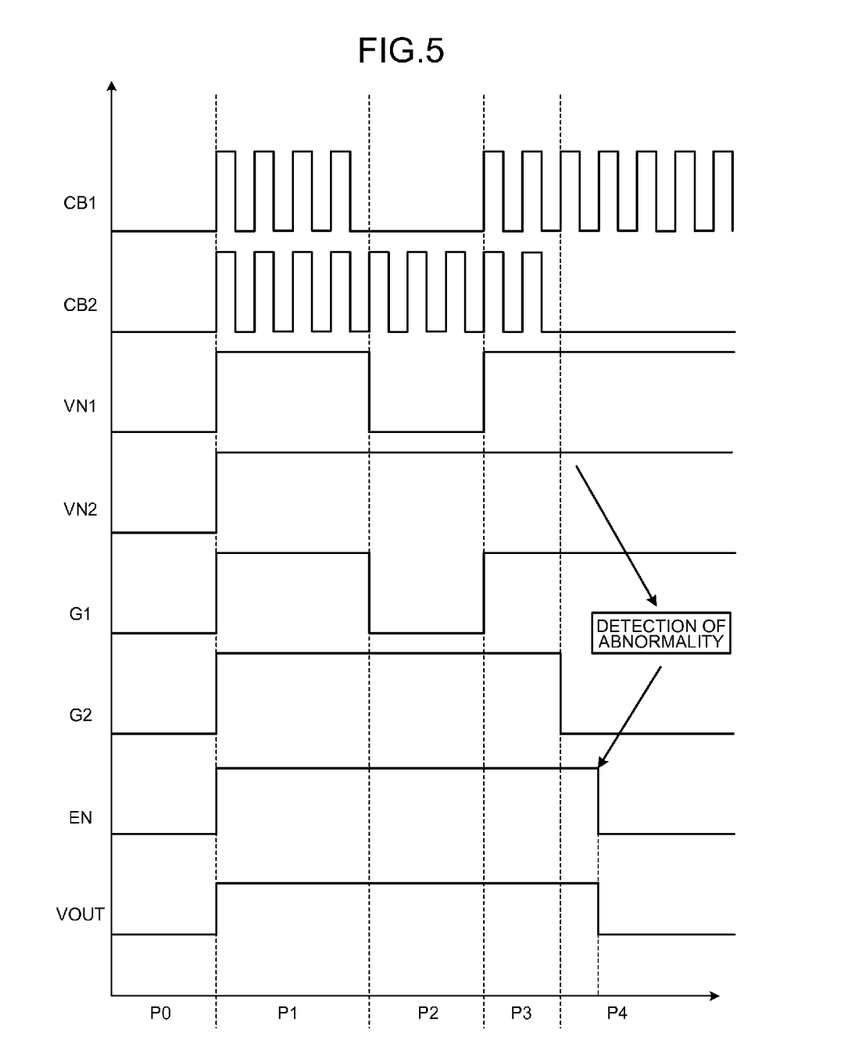
FIG. 5 is a timing chart illustrating another operation example of the power-supply control device according to the first embodiment of the present invention.

Next, a case where an abnormality has occurred in a diagnostic target circuit is described. FIG. 5 illustrates a case where, as an example, an abnormality has occurred in the second power interrupting circuit 10-2. In the period P4 described above, the second intermediate node voltage VN2 remains at a High level. Accordingly, the control circuit 30 determines that an abnormality has occurred in the second power interrupting circuit 10-2 (a diagnostic target circuit).

For example, from the viewpoint of ensuring safety, as a process to be performed in a case where an abnormality has occurred in a diagnostic target circuit, it is possible to forcibly stop the power supply to a load. With this process, the control circuit 30 changes the output control signal EN to a Low level to turn off the output circuit 20 as illustrated in FIG. 5. As a result, the output of power from the output circuit 20 to the load is stopped (the output voltage VOUT=Low level) so that the load stops its operation. At this point, it is also possible that the control circuit 30 interrupts the passage of power through all of the power interrupting circuits 10 other than the diagnostic target circuit.

When an abnormality has occurred in the diagnostic target circuit, the control circuit 30 may output an alert to notify the operator of the detection of the abnormality.

As described above, according to the present embodiment, each of the power interrupting circuits 10 can be diagnosed separately. While any of the power interrupting circuits 10 is set as a diagnostic target circuit, other power interrupting circuits 10 operate normally. Therefore, the diagnostic target circuit can be diagnosed without stopping the power supply to the load.

To ensure the reliability of the power-supply control device 1, it is preferable to perform a diagnosis regularly. That is, it is preferable that the control circuit 30 sets each of the power interrupting circuits 10 as a diagnostic target circuit regularly.

Furthermore, as illustrated in the examples in FIGS. 4 and 5, the control circuit 30 preferably sets each of the power interrupting circuits 10 as a diagnostic target circuit in turn. This setting allows the power interrupting circuits 10 to be diagnosed evenly.

Figure 6:
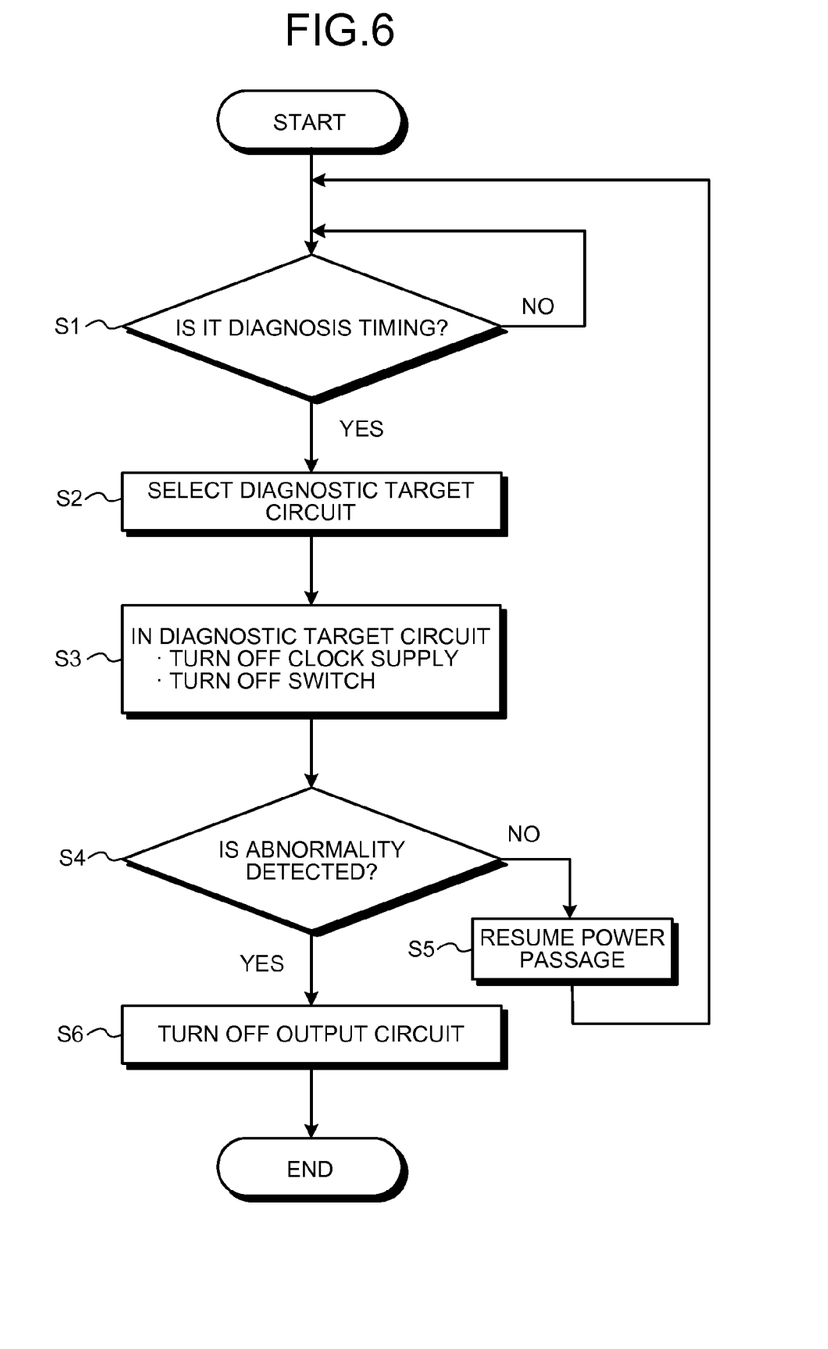
FIG. 6 is a flowchart illustrating a summary of a diagnosis method according to the first embodiment of the present invention.

FIG. 6 is a flowchart illustrating a summary of a diagnosis method according to the present embodiment. The control circuit 30 continues a normal operation until a diagnosis timing (NO at Step S1). When it is the diagnosis timing (YES at Step S1), the control circuit 30 selects a diagnostic target circuit from the power interrupting circuits 10 (Step S2). For example, the control circuit 30 selects each of the power interrupting circuits 10 as a diagnostic target circuit in turn.

Subsequently, the control circuit 30 stops the passage of power through the diagnostic target circuit. Specifically, the control circuit 30 stops supplying the clock signal CLK to the interrupting circuit 11 of the diagnostic target circuit and turns off the switch element 12 of the diagnostic target circuit (Step S3). The control circuit 30 then determines whether an abnormality has occurred in the diagnostic target circuit on the basis of the voltage at the intermediate node of the diagnostic target circuit (Step S4).

When an abnormality is not detected in the diagnostic target circuit (NO at Step S4), the control circuit 30 causes the diagnostic target circuit to return to a normal operation and causes the passage of power to be resumed (Step S5). In contrast, when an abnormality is detected in the diagnostic target circuit (YES at Step S4), the control circuit 30 turns off the output circuit 20 to stop the power supply to a load (Step S6).

<Diagnosis of Output Circuit 20>

In addition to the diagnosis of the power interrupting circuits 10, the control circuit 30 can also diagnose whether the output circuit 20 operates normally. As described above, the control circuit 30 can control ON/OFF of the output circuit 20 by using the output control signal EN. Further, the control circuit 30 monitors the output voltage VOUT output from the output circuit 20 to a load. Accordingly, the control circuit 30 can determine whether an abnormality has occurred in the output circuit 20 by comparing the ON/OFF control state of the output circuit 20 with the output voltage VOUT. When the ON/OFF control state of the output circuit 20 does not match the output voltage VOUT, the control circuit 30 determines that an abnormality has occurred in the output circuit 20.

Figure 7:
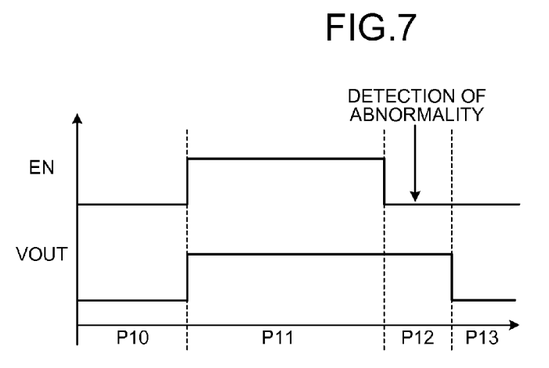
FIG. 7 is a timing chart illustrating still another operation example of the power-supply control device according to the first embodiment of the present invention.

With reference to FIG. 7, an example of the diagnosis of the output circuit 20 is described. During a period P10, the power-supply control device 1 is powered off and operations of respective circuits are stopped. Thereafter, the power-supply control device 1 is powered on. A period P11 is a normal operation period, which is identical to the period P1 described above and illustrated in FIG. 4.

A period P12 is a period for diagnosing the output circuit 20. The control circuit 30 changes the output control signal EN to a Low level. When the output circuit 20 operates normally, it is expected that the output circuit 20 is turned off and the output voltage VOUT becomes a Low level. However, in the example illustrated in FIG. 7, the output voltage VOUT remains at a High level. Accordingly, the control circuit 30 determines that an abnormality has occurred in the output circuit 20.

For example, from the viewpoint of ensuring safety, as a process to be performed in a case where an abnormality has occurred in the output circuit 20, it is possible to forcibly stop the power supply to a load. For example, the control circuit 30 interrupts the passage of power through all of the power interrupting circuits 10. That is, the control circuit 30 stops supplying the clock signal CLK to the interrupting circuits 11 and turns off the switch elements 12 in all of the power interrupting circuits 10. As a result, as illustrated in a period P13 in FIG. 7, the power supply to the load is stopped (the output voltage VOUT=Low level) and therefore the load stops its operation.

<Case where Control Circuit 30 has Fault>

When the control circuit 30 has a fault, no clock signal CLK is output from the control circuit 30. That is, the first control signal CB1 and the second control signal CB2 are kept at a High level or a Low level. Consequently, the interrupting circuits 11 of all of the power interrupting circuits 10 automatically interrupt the passage of power. As a result, the power supply to the load is automatically stopped and therefore the load stops its operation.

That is, even when the control circuit 30 has a fault, the power supply to the load can be forcibly stopped by using the clock signal CLK as a passage permitting signal. This is preferable from the viewpoint of ensuring safety.

As illustrated in FIG. 1, in each of the power interrupting circuits 10, the interrupting circuit 11 is preferably provided in front of the switch element 12. With this configuration, it becomes possible to minimize the number of constituent elements to which power is supplied when the control circuit 30 has a fault.

<Effect>

As described above, according to the present embodiment, the power interrupting circuits 10 are provided in parallel. Further, each of the power interrupting circuits 10 can be diagnosed separately. While any of the power interrupting circuits 10 is set as a diagnostic target circuit, other power interrupting circuits 10 operate normally. Therefore, the diagnostic target circuit can be diagnosed without stopping the power supply to the load. That is, while stable power is supplied to the load, the reliability of the power-supply control device 1 can be ensured.

According to the present embodiment, when an abnormality is detected in a diagnostic target circuit, by turning off the output circuit 20, the power supply to the load can be forcibly stopped. This is preferable from the viewpoint of ensuring safety.

Furthermore, according to the present embodiment, the output circuit 20 can also be diagnosed. If an abnormality is detected in the output circuit 20, the power supply to the load can be forcibly stopped by interrupting the passage of power through all of the power interrupting circuits 10. This is preferable from the viewpoint of ensuring safety.

Furthermore, according to the present embodiment, the clock signal CLK is used as a passage permitting signal supplied to the interrupting circuits 11. With this configuration, even when the control circuit 30 has a fault, the power supply to the load can be forcibly stopped. This is also preferable from the viewpoint of ensuring safety.

Second Embodiment

In a second embodiment, a case where the power-supply control device 1 described above is incorporated in a programmable logic controller (PLC) is described. A PLC is a controller that executes drive control of an industrial device in a factory or the like.

Figure 8:
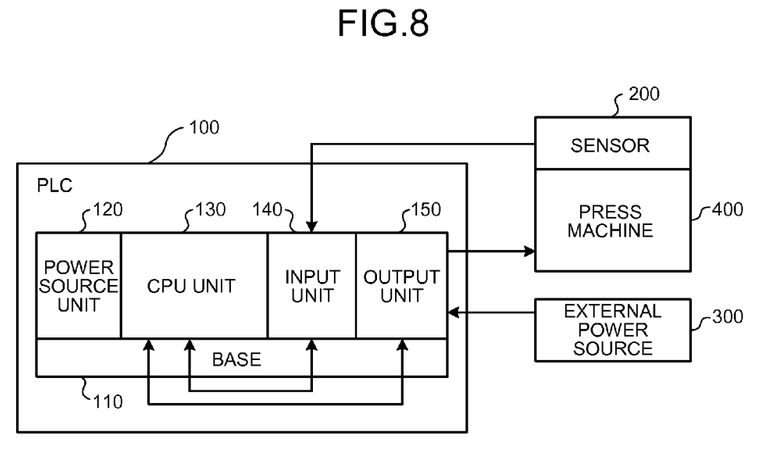
FIG. 8 is a block diagram illustrating a configuration example of a programmable logic controller according to a second embodiment of the present invention.

FIG. 8 is a block diagram illustrating a configuration example of a PLC 100 according to the present embodiment. The PLC 100 includes a base 110, a power source unit 120, a CPU unit 130, an input unit 140, and an output unit 150.

In this example, a press machine 400 is controlled by the PLC 100. More specifically, a sensor 200 detects the operation state of the press machine 400 and outputs a sensor signal indicating the detected operation state to the PLC 100. The input unit 140 receives the sensor signal from the sensor 200 and sends information related to the operation state of the press machine 400 to the CPU unit 130. The CPU unit 130 sends control information for executing ON/OFF control of the press machine 400 to the output unit 150 on the basis of the received information.

The output unit 150 controls ON/OFF of the press machine 400 on the basis of the received control information. At this point, power is supplied to the press machine 400 from an external power source 300. That is, the output unit 150 controls the power supply from the external power source 300 to the press machine 400 on the basis of the control information. The power-supply control device 1 described above is applied to the output unit 150.

Figure 9:
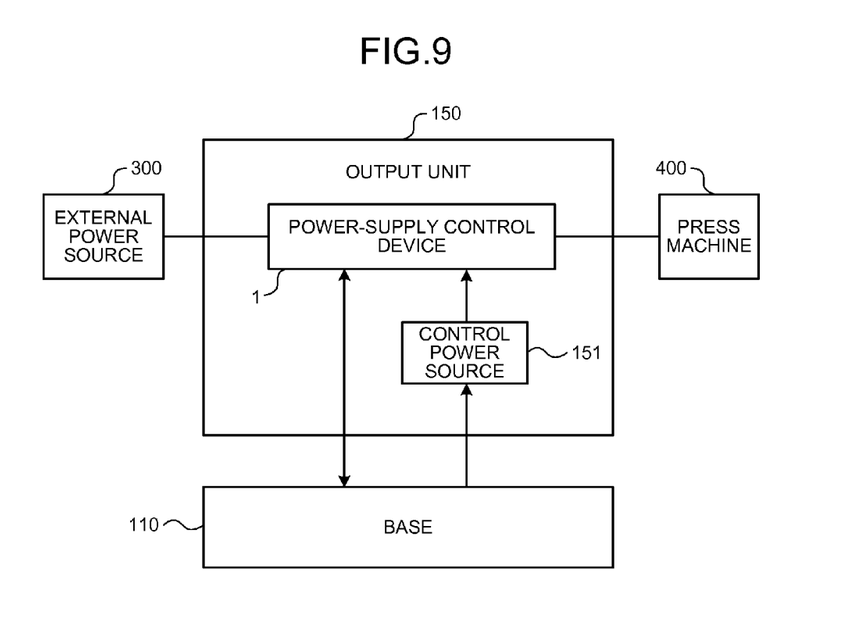
FIG. 9 is a block diagram illustrating an application example of a power-supply control device to the programmable logic controller according to the second embodiment of the present invention.

As illustrated in FIG. 9, the output unit 150 includes the power-supply control device 1 and a control power source 151. The control power source 151 is connected to the power source unit 120 via the base 110. The power-supply control device 1 operates on the basis of power supplied from the control power source 151. The power-supply control device 1 (the control circuit 30) receives the control information from the CPU unit 130 via the base 110. The power-supply control device 1 controls the power supply from the external power source 300 to the press machine 400 on the basis of the control information. That is, in this example, the press machine 400 corresponds to a load.

As described in the first embodiment, when an abnormality has occurred in the constituent elements of the power-supply control device 1, power supply to the press machine 400 can be definitely stopped. Accordingly, the safety of the press machine 400 is improved.

Embodiments of the present invention have been described above with reference to the accompanying drawings. However, the present invention is not limited to the embodiments described above, and can be modified as appropriate by persons skilled in the art without departing from the scope of the invention.

REFERENCE SIGNS LIST 1 power-supply control device, 10 power interrupting circuit, 10-1 first power interrupting circuit, 10-2 second power interrupting circuit, 11 interrupting circuit, 11-1 first interrupting circuit, 11-second interrupting circuit, 12 switch element, 12-1 first switch element, 12-2 second switch element, 20 output circuit, 30 control circuit, 100 PLC, 110 base, 120 power source unit, 130 CPU unit, 140 input unit, 150 output unit, 151 control power source, 200 sensor, 300 external power source, 400 press machine, CB1 first control signal, CB2 second control signal, CLK clock signal (passage permitting signal), G1 first switch signal, G2 second switch signal, EN output control signal, N1 first intermediate node, N2 second intermediate node, NA output node, PIN power-source input terminal, POUT output terminal, VN1 first intermediate node voltage, VN2 second intermediate node voltage, VOUT output voltage.

The invention claimed is:

1. A power-supply control device comprising:
a power-source input terminal to which power is input from a power source;
an output circuit that outputs the power to a load;
power interrupting circuits that are connected in parallel between the power-source input terminal and an output terminal connected to the output circuit; and
a control circuit that controls each of the power interrupting circuits separately,
wherein each of the power interrupting circuits includes an interrupting circuit, an intermediate node, and a switch element that are disposed in this order and connected in series between the power-source input terminal and the output terminal,
the interrupting circuit is configured to permit the power to pass when the interrupting circuit is receiving a passage permitting signal from the control circuit and to interrupt a passage of the power when the interrupting circuit is not receiving the passage permitting signal,
an ON/OFF of the switch element is controlled by the control circuit, and
when any of the power interrupting circuits is set as a diagnostic target circuit, the control circuit stops supplying the passage permitting signal to the interrupting circuit of the diagnostic target circuit and turns off the switch element of the diagnostic target circuit, detects a voltage at the intermediate node in the diagnostic target circuit, and determines whether an abnormality has occurred in the diagnostic target circuit based on the voltage at the intermediate node.

2. The power-supply control device according to claim 1, wherein, when the control circuit determines that the abnormality has occurred in the diagnostic target circuit, the control circuit turns off the output circuit.

3. The power-supply control device according to claim 1, wherein the control circuit sets each of the power interrupting circuits as the diagnostic target circuit regularly.

4. The power-supply control device according to claim 1, wherein the control circuit sets each of the power interrupting circuits as the diagnostic target circuit in turn.

5. The power-supply control device according to claim 1, wherein the passage permitting signal is a clock signal.

6. The power-supply control device according to claim 1, wherein
the control circuit controls ON/OFF of the output circuit and monitors an output from the output circuit to the load, and
when an ON/OFF control state of the output circuit does not match the monitored output, the control circuit determines that an abnormality has occurred in the output circuit.

7. The power-supply control device according to claim 6, wherein, when the control circuit determines that the abnormality has occurred in the output circuit, the control circuit stops supplying the passage permitting signal to the interrupting circuit and turns off the switch element in all of the power interrupting circuits.

8. The power-supply control device according to claim 1, wherein the power-supply control device is incorporated in a programmable logic controller that executes drive control of a device, and
the load is the device.

9. A programmable logic controller that executes drive control of a device, the programmable logic controller comprising:
a power-source input terminal to which power is input from a power source;
an output circuit that outputs the power to the device;
power interrupting circuits that are connected in parallel between the power-source input terminal and an output terminal connected to the output circuit; and
a control circuit that controls each of the power interrupting circuits separately,
wherein each of the power interrupting circuits includes an interrupting circuit, an intermediate node, and a switch element that are disposed in this order and connected in series between the power-source input terminal and the output terminal,
the interrupting circuit is configured to permit the power to pass when the interrupting circuit is receiving a passage permitting signal from the control circuit and to interrupt a passage of the power when the interrupting circuit is not receiving the passage permitting signal,
an ON/OFF of the switch element is controlled by the control circuit, and
when any of the power interrupting circuits is set as a diagnostic target circuit, the control circuit stops supplying the passage permitting signal to the interrupting circuit of the diagnostic target circuit and turns off the switch element of the diagnostic target circuit, detects a voltage at the intermediate node, and determines whether an abnormality has occurred in the diagnostic target circuit based on the voltage at the intermediate node.

* * * * *